MOUNTING TAB FOR SEMICONDUCTOR DEVICES

Filed Dec. 8, 1961

INVENTORS
T. N. FOGARTY
J. E. GRIFFIS
W. M. KILPATRICK JR.
J. N. LESYK
By A. J. Nugent
ATTORNEY 3,215,907
Patented Nov. 2, 1965

3,215,907

MOUNTING TAB FOR SEMICONDUCTOR DEVICES

Thomas N. Fogarty, Allentown, Pa., Jack E. Griffis, Kansas City, Mo., and William M. Kilpatrick, Jr., Nazareth, and Joseph N. Lesyk, Allentown, Pa., assignors to Western Electric Company, Incorporated, New York, N.Y., a corporation of New York Filed Dec. 8, 1961, Ser. No. 158,073
3 Claims. (Cl. 317—234)

This invention relates to semiconductor devices and particularly to transistors and diodes.

Heretofore, transistors, such as the alloy junction type, were designed in such a manner that the mechanized assembly thereof was quite difficult. Consequently, production of the transistors was at a slow rate, and at times, a high number of rejections resulted. For instance, a gold base ring, utilized for making contact with the base post and for attaching the base wires to the semiconductor wafer, caused serious difficulties. First, unless the gold wets the semiconductor wafer simultaneously along its entire surface, a condition known as a "D" ring resulted which caused failure of the transistor at a 500-volt pulsing operation and/or a cracking of the semiconductor wafer. Second, any undercutting of the semiconductor wafer with respect to the gold base ring caused the gold base ring to overlap the edge of and alloy into the semiconductor wafer. Thus, a structurally weak unit resulted and it became necessary to place strict control on the size of the semiconductor wafer. Finally, the use of gold as a base ring caused undesirable stresses resulting from differences in the thermal-coefficient of expansion between the gold, the gold-semiconductor wafer eutectic, and the semiconductor wafer; such stresses ultimately causing pulsing rejects.

A further consideration in transistor fabrication for improved and more stable electrical characteristics is the cleanliness of the transistor mount and element prior to encapsulation. However, previous complicated transistor designs, such as those employing a J-type collector bracket, were more difficult to clean, since it was physically difficult to remove foreign matter, such as lint, trapped in portions of the mount. Consequently, some undesirable foreign matter remained at the time the assembled mount was encapsulated in its can housing.

The object of this invention is a transistor mount of simple design and capable of mechanized assembly in a quick and expeditious manner.

Another object of this invention is a transistor whose mount is capable of being thoroughly cleaned prior to the encapsulation thereof.

Still another object of this invention is a transistor having a high resistance to shock and vibration.

In accordance with the general features of this invention, a transistor is comprised of a header platform having emitter, collector and base posts extending therethrough. A metallic mounting tab extends vertically transverse to the platform between the emitter and collector posts, the tab having a recessed portion for holding a semiconductor element therein. The tab is welded at one end to the base post and has an integral flap extending perpendicularly from its other end which is welded to the header platform. A metallic element of a conductivity determining type is alloyed on each side of the semiconductor element and a metallic ribbon connects the collector and emitter posts to their respective conductivity determining metallic elements.

One phase of the invention relates to the grounding of the base tab to the header platform rather than to the emitter post.

Still another phase of the invention relates to the application of a minimum of welding areas for securing the base tab in a rigid manner. More specifically, the use of only two welding areas is required.

Other objects will be apparent and a fuller understanding of the invention may be had by referring to the following description and claims, taken in conjunction with the accompanying drawing, in which:

Figures 1, 2:
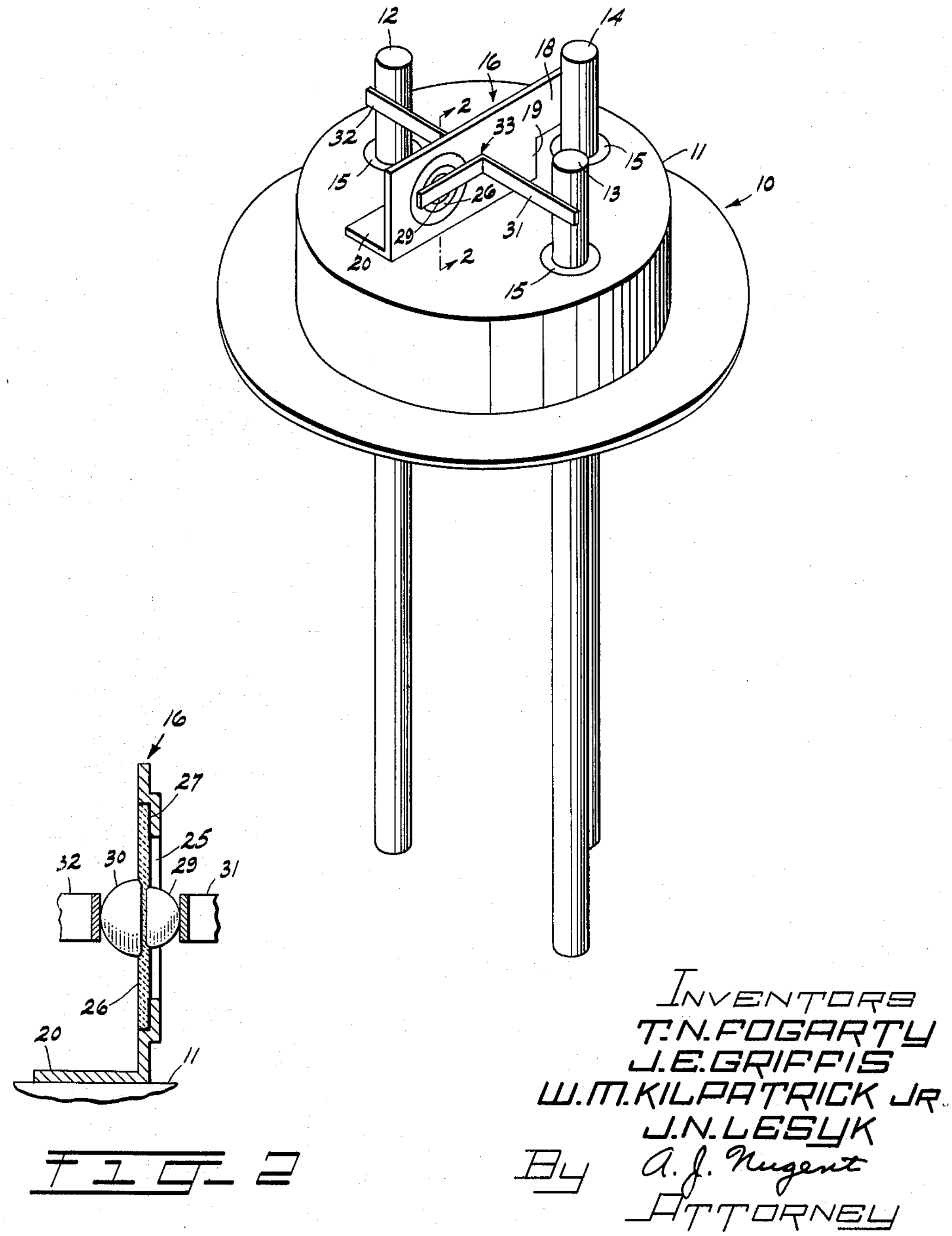
FIG. 1 is an isometric view of a transistor mount illustrating the invention.
FIG. 2 is a cross-section view taken along the line 2—2 of FIG. 1.

With reference to the drawing, a transistor mount 10 is comprised of a header platform 11, preferably of Kovar material with a gold flash coating thereon, and a collector post 12, emitter post 13 and base post 14 extending therethrough and being glass sealed at 15 therein. A metallic tab, generally referred to at 16 and preferably of nickel material for permitting maximum heat conductivity, vertically extends transverse the top surface of the platform 11 and has an L-shaped front end portion which includes a long arm 18 and a short arm 19, the long arm being welded to base post 14. It is to be noted, however, that other type configurations for the front end portion may be utilized, such as, a straight or arcuate edge. However, the L-shaped configuration is preferred since it lends itself to simple fabrication and is sufficiently clear of the meniscus of the glass seal 15 securing post 14 to the header platform.

An integral flap 20 extends perpendicularly from the back end base portion of tab 16, said flap extending from the other side of the welded base post connection and being welded to the header platform 11. Thus, the tab is simply and rigidly supported on the mount by virtue of its being welded on its opposite sides along a horizontal and a vertical plane.

One side of the tab is provided with a recess 25 which is clad with a lead, tin and antimony solder 27 for use in the bonding of a semiconductor element 26, such as a germanium wafer, and also for accommodating any stress set up by the thermal mismatch between the germanium and the nickel. An emitter button 29 is alloyed to one side of wafer 26, and a collector button 30 is alloyed on the other side, said buttons being of a metal of a conductivity determining type, such as indium. A pair of metallic ribbons 31 and 32, preferably made of nickel material for their heat dissipation capabilities, connect the collector post 12 with collector button 30 and emitter post 13 with emitter button 29. It is noted that ribbons 31 and 32 have L-shaped end portions 33 which serve not only to provide additional ruggedness at the button junctions but also to insure contact with the buttons regardless of any variation in size or location of the buttons on wafer 26 resulting from their mechanized fabrication. It is noted that the heat generated at the collector junction is much more readily dissipated due to the base tab being mounted directly to the header platform and due to the use of the L-shaped end portions of the ribbons.

A method of assembling such a transistor mount may be obtained by first forming a metallic tab 16 whose configuration is such that it contains a recessed portion 25, a substantially L-shaped front end portion, and a flap 20 extending perpendicularly from one side near its back end portion. A germanium wafer 26 is bonded to the recessed portion 25 at the same time as the collector and emitter buttons 29 and 30 are alloyed to opposite sides of the wafer. After assembling the tab, the header is positioned within a holding fixture and the tab is located on the header platform 11 such that the long arm 18 of the tab is adjacently disposed to base post 14, and the base flap 20 rests on the header platform. The long arm 18 is then welded to base post 14, and the base flap 20 is welded to the header platform, these two welds being the only welded areas for supporting the tab. Despite the employment of only two welds, transistor units fabricated in accordance with the present invention have remained completely intact under the severest operating tests. The leading end portions of ribbons 31 and 32 are formed into substantially L-shaped configuration and advanced towards their respective buttons 29 and 30 until they make contact therewith whereupon the ribbons are welded to their respective posts. The welding technique utilized for the connection of the ribbons and tab may be one similar to that disclosed in U.S. Patent 2,951,932. Each ribbon is severed from its ribbon supply at the welded post connection, and finally, the amount is placed in an oven containing a reducing atmosphere for bonding the L-shaped end portions 33 to the indium buttons 29 and 30.

It is to be understood that the above-described arrangements are simply illustrative of the application of the principles of the invention. Obviously, while a transistor is disclosed, diodes may be fabricated by connecting a ribbon between one post and a single conductivity determining element. Numerous other arrangements may be readily devised by those skilled in the art which will embody the principles of the invention and fall within the spirit and scope thereof.

What is claimed is:

1. In a transistor comprising a header platform, emitter, collector and base posts extending through the platform, a metallic mounting tab vertically extending transverse the platform between the emitter and collector posts and having a recessed portion for holding a semiconductor element therein, a semiconductor element bonded to said recessed portion, a metallic element of a conductivity determining type connected on each side of the semiconductor element, a metallic ribbon connecting the collector and emitter posts to their respective metallic elements, the end portion of said ribbon connected to the metallic elements being of substantially L-shaped configuration, and the tab having an L-shaped end portion including a long leg and a short leg, said long leg extending in a horizontal direction parallel to the header platform and being welded to the base post, said short leg extending in a vertical plane perpendicular to the header platform and parallel to the base post, and the other end of the tab having an integral flap extending perpendicularly therefrom and being welded to the header platform, said long leg and integral flap welds being the sole welds for supporting the tab.

2. In a transistor comprising a header platform, emitter, collector and base posts extending through the platform, a metallic mounting tab vertically extending transverse the platform between the emitter and collector posts and having a recessed portion for holding a semiconductor element therein, a semiconductor element bonded to said recessed portion, a metallic element of a conductivity determining type connected on each side of the semiconductor element, a metallic ribbon connecting the collector and emitter posts to their respective metallic elements, the end portion of said ribbon connected to the metallic elements being of substantially L-shaped configuration, and the tab having an L-shaped end portion including a long leg and a short leg, said long leg extending in a horizontal direction parallel to the header platform and being welded to the base post, said short leg extending perpendicular to the header platform and parallel to the base post, and the other end of the tab having an integral flap extending perpendicularly therefrom in a direction opposite to the welded base post and being welded to the header platform, said long leg and integral flap welds being in two different planes on opposing sides of and for supporting the tab.

3. In a transistor comprising a header platform, emitter, collector and base posts extending through the platform, a metallic mounting tab vertically extending transverse the platform between the emitter and collector posts and having a recessed portion for holding a semiconductor element therein, a semiconductor element bonded to said recessed portion, a metallic element of a conductivity determining type connected on each side of the semiconductor element, a metallic ribbon connecting the collector and emitter posts to their respective metallic elements, the end portion of said ribbon connected to the metallic elements being of substantially L-shaped configuration, and the tab having an L-shaped end portion including a long leg and a short leg, said long leg extending in a horizontal direction parallel to the header platform and whose lateral surface contacts the base post, said short leg extending in a vertical plane perpendicular to the header platform and parallel to the base post, and the other end of the tab having an integral flap extending perpendicularly from its opposing lateral surface over the header platform, the tab being supported solely by the welding of the long arm to the base post and the integral flap to the header platform.

References Cited by the Examiner

UNITED STATES PATENTS

| | | | |
|---|---|---|---|
| 2,882,462 | 4/59 | Zierdt | 317—235 |
| 2,914,716 | 11/59 | Larrison | 317—235 |
| 2,947,925 | 8/60 | Mayard et al. | 317—235 |
| 2,998,555 | 8/61 | Klossika | 317—234 |
| 3,001,109 | 9/61 | Trent | 317—234 |

DAVID J. GALVIN, *Primary Examiner.*

JAMES D. KALLAM, *Examiner.*